United States Patent [19]
Sawamura

[11] Patent Number: 5,673,424
[45] Date of Patent: Sep. 30, 1997

[54] CIRCUIT WHICH SUPPLIES A CLOCK PULSE TO A MICROCOMPUTER

[75] Inventor: Yo Sawamura, Kyoto, Japan

[73] Assignee: Rohm Co., Ltd., Kyoto, Japan

[21] Appl. No.: 748,795

[22] Filed: Nov. 14, 1996

Related U.S. Application Data

[63] Continuation of Ser. No. 284,242, Aug. 2, 1994, abandoned.

[30] Foreign Application Priority Data

Aug. 6, 1993 [JP] Japan ................................. 5-195687

[51] Int. Cl.$^6$ ........................................................ G06F 1/04
[52] U.S. Cl. ............................ 395/555; 331/74; 331/158
[58] Field of Search ................................ 395/555, 556; 364/270, 270.1, 270.2; 331/74, 173, 158; 327/172, 291

[56] References Cited

U.S. PATENT DOCUMENTS

| | | | |
|---|---|---|---|
| 4,864,255 | 9/1989 | Yoshida | 331/75 |
| 5,184,032 | 2/1993 | Leach | 307/443 |
| 5,369,311 | 11/1994 | Wang et al. | 327/292 |
| 5,454,114 | 9/1995 | Yach et al. | 395/750 |
| 5,511,126 | 4/1996 | Westwick | 331/44 |

OTHER PUBLICATIONS

Sergio Franco, "Design With Operational Amplifiers and Integrated Circuits", McGraw-Hill, 1988, pp. 313-323, 354-359 and 369-371.
Joseph Greenfield, "Practical Digital Design Using Ics", John Wiley and Sons, 1977, pp. 126-130.
Texas Instruments, "The TTL Data Book Volume 2", 1985, pp. 3-75 to 3-93.

*Primary Examiner*—Dennis M. Butler
*Attorney, Agent, or Firm*—Nikaido Marmelstein Murray & Oram LLP

[57] ABSTRACT

A circuit which supplies a clock pulse to activate the microcomputer includes a sinusoidal wave oscillation circuit. A sinusoidal wave/pulse converting circuit is provided which converts an oscillation output of the sinusoidal wave oscillation circuit into a clock pulse when the level of the oscillation output exceeds a predetermined value. The clock pulse is supplied to the microcomputer by the converting circuit. The converting circuit includes a first inverter having a threshold value on the high voltage side of the central level of the amplitude of the oscillation output and a second inverter having a threshold value on the low voltage side of the central level of the amplitude. In addition, the converting circuit includes an RS flip flop which generates a clock pulse whose level changes alternately by the outputs of the first and second inverters.

1 Claim, 3 Drawing Sheets

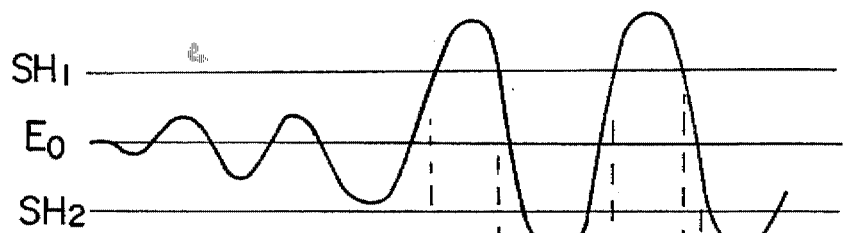

CIRCUIT WHICH SUPPLIES A CLOCK PULSE TO A MICROCOMPUTER

This application is a continuation of application Ser. No. 08/284,242 filed on Aug. 2, 1994 now abandoned.

BACKGROUND OF THE INVENTION

1. Field of the Invention

The present invention relates to a microcomputer system including a microcomputer and a circuit which supplies a clock pulse to the microcomputer.

2. Description of the Prior Art

Referring to FIG. 1, there is shown a conventional microcomputer system, wherein a sinusoidal wave oscillation circuit 40 includes an amplifier 41, a crystal oscillator 42, a resistor 43 and capacitors 44 and 45 which are arranged in a manner as shown in the figure. In the oscillation output of the sinusoidal wave oscillation circuit 40, as shown at (a) of FIG. 2, the oscillation signal is small when the power is activated, and increases with time. Since the threshold values of buffers 46 and 47 connected to the oscillation circuit 40 are a central level $E_0$ of the amplitude of the sinusoidal wave which is the oscillation output of the oscillation circuit 40, the sinusoidal wave is converted to a pulse as shown at (b) of FIG. 2.

The pulse is supplied to the microcomputer 50 as a clock to drive the microcomputer 50. However, the oscillation signal is extremely unstable immediately after the activation of the power since it is indistinguishable from noise because of the smallness of the oscillation signal. As a result, a pulse $P_1$ is generated which is random and unstable for a clock pulse. The pulse $P_1$ causes the microcomputer to maloperate. To prevent the maloperation by this pulse, a counter 48 is provided in the conventional system.

The counter 48 generates a reset signal when it has counted the clock pulse to a predetermined value, thereby bringing the microcomputer 50 into operable condition. While the counter 48 is counting the clock pulse, the microcomputer 50 does not start operating even though the clock pulse is supplied to the microcomputer 50. The bit number of the counter 48 is set so that the counter 48 continues counting all through the unstable period immediately after the activation of the power.

However, when the period during which the output of the oscillation circuit 40 is unstable is long, the unstable clock pulse is input to the microcomputer 50 even after the counter 48 resets and starts the microcomputer 50. As a result, the microcomputer maloperates. If the set value of the counter 48 is increased to ensure that the counter 48 continues counting all through the unstable period, the start of the microcomputer 50 will be delayed when the unstable period is short. In addition, the bit number is necessarily increased to increase the set value of the counter 48, and if the bit number is increased, the size of the counter will increase to largely occupy a space in an integrated circuit device.

SUMMARY OF THE INVENTION

An object of the present invention is to provide a microcomputer system of a simple structure in which a normal clock pulse is supplied to the microcomputer in an appropriate manner irrespective of the length of the period during which the oscillation output is unstable.

To achieve the above-mentioned object, a system of the present invention is provided with a sinusoidal wave/pulse converting circuit which converts an oscillation output of a sinusoidal wave oscillation circuit into a clock pulse when the oscillation output exceeds a predetermined value. The clock pulse is supplied to the microcomputer by the converting circuit.

With such a feature, the circuit which converts the sinusoidal wave into a clock pulse does not operate while the input oscillation signal is small; it starts operating when the input oscillation signal exceeds a threshold value to supply the clock pulse to the microcomputer. Therefore, when the period during which the oscillation output is unstable (period during which the oscillation signal is a predetermined value or lower) is short, the microcomputer quickly starts operating, and when the unstable period is long, the start of the microcomputer is delayed accordingly. Thus, a highly reliable system is realized.

BRIEF DESCRIPTION OF THE DRAWINGS

This and other objects and features of this invention will become clear from the following description, taken in conjunction with the preferred embodiments with reference to the accompanied drawings in which:

FIG. 5(a)–5(b) show waveform charts of assistance in explaining an operation of the circuit of FIG. 4.

DESCRIPTION OF THE PREFERRED EMBODIMENTS

Figure 1:
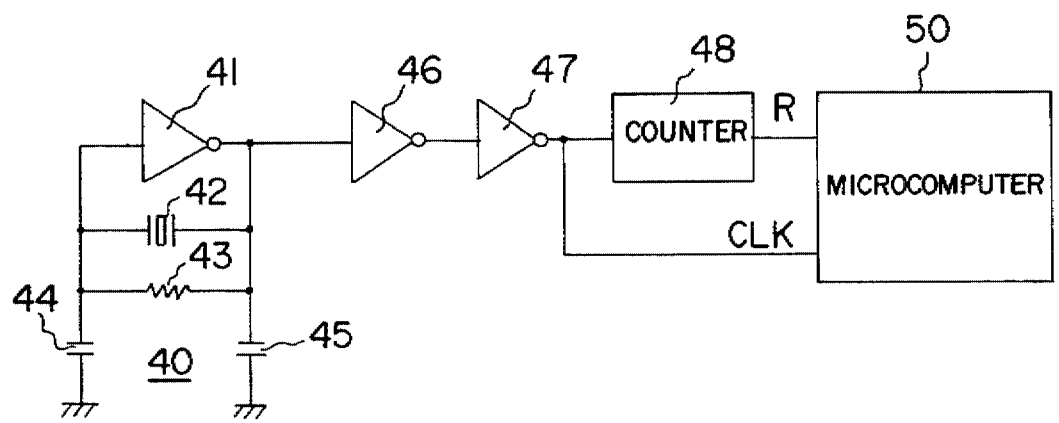
FIG. 1 shows a circuit arrangement of a conventional microcomputer system.
Figure 2A:
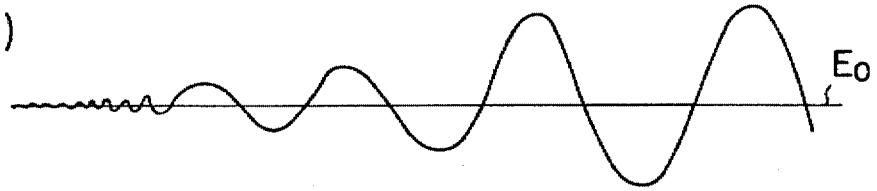
FIGS. 2(a)–2(b) show waveform charts of assistance in explaining an operation of the conventional microcomputer system.
Figure 2B:
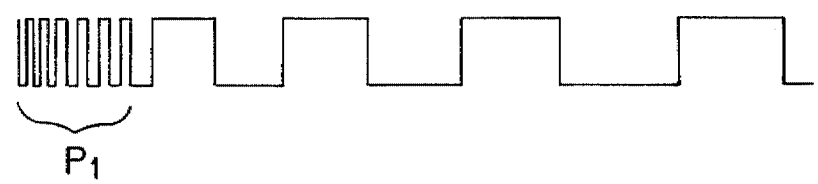
Figure 3:
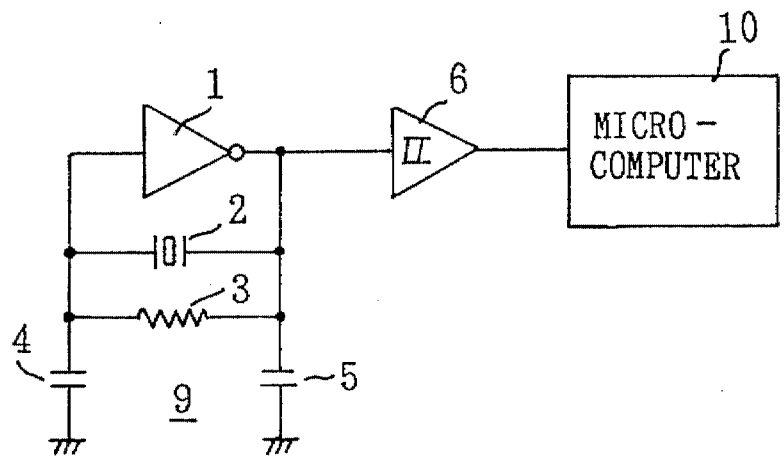
FIG. 3 shows a circuit arrangement of a microcomputer system embodying the present invention.

Hereinafter, the present invention will be described with reference to an embodiment. Referring to FIG. 3 showing the embodiment of the present invention, reference numeral 9 represents a sinusoidal wave oscillation circuit including an amplifier 1, a crystal oscillator 2, a resistor 3 and capacitors 4 and 5. Reference numeral 6 represents a sinusoidal wave/pulse converting circuit which converts an oscillation output of the sinusoidal wave oscillation circuit 9 into a clock pulse when the level of the output exceeds a predetermined value. Reference numeral 10 represents a microcomputer to which the clock pulse is supplied from the sinusoidal wave/pulse converting circuit 6. As the sinusoidal wave/pulse converting circuit 6, a Schmitt circuit may be used.

Figure 4:
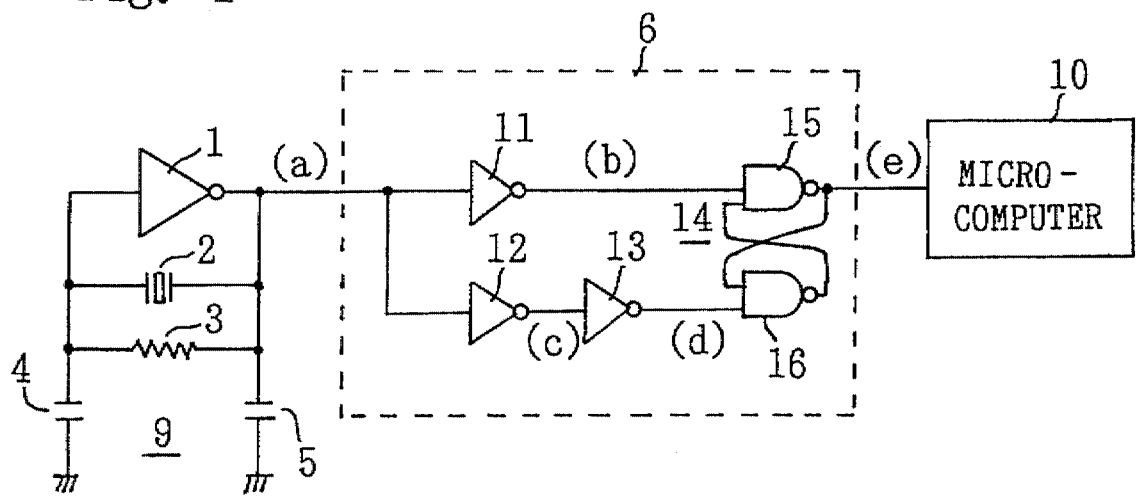
FIG. 4 is a circuit diagram showing a specific arrangement of a sinusoidal wave/pulse converting circuit used in the system of FIG. 3.

Referring to FIG. 4, there is shown a specific arrangement of the sinusoidal wave/pulse converting circuit 6. The other parts are the same as those of FIG. 3. The sinusoidal wave/pulse converting circuit 6 includes a first inverter 11, a second inverter 12, a third inverter 13 and a reset-set (RS) flip flop 14. The first, second and third inverters 11, 12 and 13 include complementary metal oxide semiconductor (CMOS). As shown at (a) of FIG. 5, a threshold value $SH_1$ of the first inverter 11 is on the high voltage side of the central level $E_0$ of the amplitude of the sinusoidal wave oscillation signal, whereas a threshold value $SH_2$ of the second inverter 12 is on the low voltage side thereof. The threshold values $SH_1$ and $SH_2$ are symmetrical with respect to the central level $E_0$. The inverter 13 merely inverts the signal. The RS flip flop 14 includes two NAND circuits 15 and 16.

An operation of the circuit of FIG. 4 will be described. No clock pulse is output from the converting circuit 6 immediately after the sinusoidal wave oscillation circuit 9 starts operating by the activation of the power. This is because the oscillation output of the oscillation circuit 9 is small as shown at (a) of FIG. 5 and does not reach the threshold values $SH_1$ and $SH_2$. When the sinusoidal wave oscillation signal exceeds the threshold values $SH_1$ and $SH_2$, a minus pulse as shown at (b) of FIG. 5 is generated from the first inverter 11. From the second inverter 12, a plus pulse as shown at (c) of FIG. 5 is generated.

The output of the second inverter 12 is inverted into a minus pulse as shown at (d) of FIG. 5 by the third inverter 13. When the output pulses (b) and (d) of the first and third inverters 11 and 13 are input to the RS flip flop 14, a clock pulse as shown at (e) of FIG. 5 is output from the RS flip flop 14. Specifically, the RS flip flop 14 is set at the falls $A_1$, $A_2$, ... of the output pulse (b) of the first inverter 11, so that the output (e) of the RS flip flop 14 rises. The RS flip flop 14 is reset at the falls $B_1$, $B_2$ ... of the output pulse (d) of the third inverter 13, so that the output (e) of the RS flip flop 14 falls. The output of the RS flip flop 14 is supplied to the microcomputer 10. By the clock pulse, the microcomputer 10 is brought into operable condition.

As described above, according to the present invention, since the supply of the clock pulse is stopped while the oscillation output of the sinusoidal wave oscillation circuit is unstable whether the unstable period is short or long, the unstable clock pulse is never supplied to the microcomputer, and the start of the microcomputer is not delayed. Further, compared to the conventional system where a counter is used, the size of the circuit is small.

Obviously, many modifications and variations of the present invention are possible in light of the above teachings. It is therefore to be understood that within the scope of the appended claims, the invention may be practiced other than as specifically described.

What is claimed is:

1. A microcomputer system comprising:

a microcomputer;

a sinusoidal wave oscillation circuit; and a sinusoidal wave/pulse converting circuit which converts an oscillation output of the sinusoidal wave oscillation circuit into a clock pulse when the oscillation output exceeds a predetermined value, said sinusoidal wave/pulse converting circuit supplying the clock pulse to the microcomputer, wherein said sinusoidal wave/pulse converting circuit comprises:

a first inverter, connected to said sinusoidal wave oscillation circuit, said first inverter having a threshold value on a high voltage side of a central level of an amplitude of the oscillation output;

a second inverter, connected to said sinusoidal wave oscillation circuit, said second inverter having a threshold value on a low voltage side of the central level of the amplitude of the oscillation output;

a third inverter, connected to an output of said second inverter, said third inverter inverts an output pulse of the second inverter; and a reset-set flip flop, connected to said first inverter, said third inverter, and said microcomputer, said reset flip-flop generates a clock pulse whose level changes alternately by an output of the first inverter and an output of the third inverter.

* * * * *